United States Patent [19]

Maeda et al.

[11] Patent Number: 5,113,865
[45] Date of Patent: May 19, 1992

[54] METHOD AND APPARATUS FOR CORRECTION OF PHASE DISTORTION IN MR IMAGING SYSTEM

[75] Inventors: Akira Maeda, Gardena, Calif.; Takashi Kasama, Yokohama, Japan; Tetsuo Yokoyama, Tokyo, Japan; Hiroshi Nishimura, Kashiwa, Japan

[73] Assignees: Hitachi Medical Corporation, Tokyo; Hitachi Ltd., Kodaira; Hitachi Microcomputer Engineering Ltd., Tokyo, all of Japan

[21] Appl. No.: 333,398

[22] Filed: Apr. 5, 1989

[30] Foreign Application Priority Data

Apr. 6, 1988 [JP] Japan .................................. 63-82911
Jul. 11, 1988 [JP] Japan .................................. 63-170928

[51] Int. Cl.⁵ .................................................. A61B 5/055
[52] U.S. Cl. ............................... 128/653.2; 324/307; 324/309
[58] Field of Search ................... 128/653 A; 324/307, 324/309, 312; 364/413.17, 413.19, 413.2

[56] References Cited

U.S. PATENT DOCUMENTS

| 4,205,375 | 5/1980 | Inouye et al. | 364/413.2 |
| 4,713,614 | 12/1987 | Hoshino et al. | 324/307 |
| 4,746,860 | 5/1988 | Satoh | 324/309 |
| 4,766,382 | 8/1988 | Ohuchi | 324/312 |
| 4,823,085 | 4/1989 | Fuderer et al. | 324/312 |
| 4,844,077 | 7/1989 | Sano et al. | 128/653 |
| 4,857,844 | 8/1989 | Van Vaals | 324/307 |
| 4,875,012 | 10/1989 | Maeda et al. | 324/309 |

OTHER PUBLICATIONS

"A Spatially Non-Linear Phase Correction for MR Angiography", Sixth Annual Meeting and Exhibition 1987, p. 29.

Primary Examiner—Lee S. Cohen
Assistant Examiner—K. M. Pfaffle
Attorney, Agent, or Firm—Pennie & Edmonds

[57] ABSTRACT

In one aspect of correcting phase distortion in an MR imaging system at high speed and with high precision, partial regions having any shapes are established on a complex image reconstruction, linear phase distortion is estimated for every partial region and the phase distortion of the whole image is corrected by use of the estimated phase distortion. In another aspect, a plurality of phase distortion patterns are measured in advance through phantom imaging and stored. The phase distortion pattern is invariable and hence it is not necessary to perform the measurement for each impage processed. Phase distortion included in data acquired through imaging is corrected by representing it as a summation of the plurality of phase distortion patterns with weighting factors.

23 Claims, 6 Drawing Sheets

METHOD AND APPARATUS FOR CORRECTION OF PHASE DISTORTION IN MR IMAGING SYSTEM

BACKGROUND OF THE INVENTION

The present invention relates to an in-vivo tomographic imaging system utilizing a nuclear magnetic resonance phenomenon, and more particularly to a phase distortion correcting method and apparatus suitable for attainment of phase distortion correction with high precision by use of only a tomographic or cross-sectional image.

In an inversion recovery (IR) method which is one of the magnetic resonance (MR) imaging methods, an image is acquired in which information concerning a parameter of an object called a longitudinal relaxation time is emphasized. A detection signal acquired by use of the IR method involves phase information. Therefore, this method has a problem in that the influence of phase distortion appears on a complex image reconstruction.

In a Dixon method of separating water and fat images from each other by use of chemical shift information, a difference in resonance frequency between water and fat is used to deliberately provide a phase difference between water and fat, thereby separating water and fat from each other. Since this method also uses phase information, it is affected by phase distortion.

Angiography for extracting the shape of blood vessels and blood flow measurement of measuring the flow rate of blood utilize the fact that the phase of a moving portion changes on a reconstructed image. Therefore, there is a problem that the presence of any phase distortion makes it difficult to correctly determine the shape of blood vessels or the flow rate of blood.

The conventional approaches of correcting phase distortion in a reconstructed complex image acquired in the above-mentioned IR method, Dixon method, blood flow measurement and angiography involve two methods, e.g. a method (1) in which phase distortion is calculated and corrected by preliminarily imaging a uniform object called a phantom in the same procedure as a procedure for acquiring a tomographic image, as disclosed by JP-A-61-194338, and a method (2) in which phase distortion is estimated and corrected through repetitive calculation (see "A Spatially Non-linear Phase Correction for MR Angiography", Sixth Annual Meeting and Exhibition, p. 29, 1987).

The method (1) has a problem in that the phase distortion generally changes depending on the time, the imaging means and the position of a tomographic image acquired, and therefore the imaging of the phantom has to be carried out frequently, thereby requiring a complicated operation and a long operation time. In the method (2), the phase distortion is corrected by use of only a tomographic image. However, since the phase distortion is estimated by use of the repetitive calculation, a large amount of calculation and hence a long time are required for estimation of the phase distortion. Therefore, the method (2) has a problem that the precision of correction is deteriorated since the optimum estimation value cannot always be determined in the case where the calculation is discontinued after a finite number of repetitions.

SUMMARY OF THE INVENTION

An object of the present invention is to solve the above-mentioned problems, thereby providing a method and apparatus in which phase distortion can be corrected in a short time and with high precision by use of only data of a tomographic image acquired.

In the present invention, the problem in the above-mentioned conventional correction method (2) is solved as follows. First, the reconstructed image consisting of complex valued pixels is partitioned into a plurality of one or more partial regions (hereinafter referred to as block) each having any given shape although generally rectangular, is and a calculated size and then non-linear phase distortion is estimated and corrected for every block. The division of the complex image into blocks reduces large non-linear phase distortion of the whole complex image, thereby improving the precision of correction.

A processing of phase distortion correction for each block is derived from Fourier-transforming image data in that block to determine the coordinates of a peak position as well as a phase rotation angle at the peak position coordinates. The determined values are used to approximately correct phase distortion in the block. Thereby, the phase distortion which assumes apparently discontinuous values in the block can be regarded as being phase distortion which is continuous within a range from $+\pi$ to $-\pi$. The remaining phase distortion is estimated and corrected through the least square method or the like. Thereafter, the discontinuity of phase distortion between blocks is corrected. Since the complex image is constructed in itself by only a real part if no phase distortion is present, the values of image data in blocks are converted into the values of real numbers after the discontinuity of phase distortion between blocks has been corrected.

The problem in the above-mentioned conventional correction method (1) is solved in the present invention as follows. A plurality of phase distortion patterns are preliminarily measured through phantom imaging and are stored. Since these phase distortion patterns are invariable, it is not necessary to carry out the measurement every imaging. Phase distortion included in data later acquired by imaging is corrected by representing it as a summation of the stored plurality of phase distortion patterns with weighting factors. Now assume that the data acquired by imaging are $C_{ij}$ (i, j = 1, 2, ..., N and N being the size of image, the phase distortion is $\theta_{ij} = \arg(C_{ij})$, the phase distortion patterns are $\psi_{ij}^{(k)}$ (k = 1, 2, ..., M and M being the number of phase distortion patterns equal to or greater than 1) and the weighting factors are $\alpha^{(k)}$ (k = 1, 2, ..., M). Here, "arg" is a function by which the phase (or argument) of a complex number is determined. The weighting factor $\alpha^{(k)}$ is defined so as to minimize $$F = \sum_{i,j=1}^{N} \left( \theta_{ij} - \sum_{k=1}^{M} \alpha^{(k)} \psi_{ij}^{(k)} \right)^2. \quad (1)$$

The phase distortion is corrected by the following equation:

$$C_{ij} = \tilde{C}_{ij} \cdot \exp\left[-\sqrt{-1} \sum_{k=1}^{M} a^{(k)} \psi_{ij}^{(k)}\right] \quad (2)$$

where $\tilde{C}_{ij}$ is an image after the phase distortion has been corrected. In order to eliminate the influence of noise summation over the whole image following the equation (1) may be replaced by a summation for only the positions (i, j) of pixels at which the absolute value of $\tilde{C}_{ij}$ is greater than a given threshold value. If phase distortion $\tilde{\theta}_{ij} = \arg(\tilde{C}_{ij})$ for $\tilde{C}_{ij}$ of the equation (2) is determined and the correction according to the equations (1) and (2) is repeated, the precision of correction is further improved.

A range of values which the phase distortion $\theta_{ij}$ can take, maybe $-180° \leq \theta_{ij} < 180°$. However, this range is limited to, for example, $-90° \leq \theta_{ij} < 90°$ and the summation following the equation (1) is calculated for only pixel positions (i,j) at which $\theta_{ij}$ has values within the limited range.

Alternatively, an assembly $S = \{(i,j) \mid -90° \leq \theta_{ij} < 90°\}$ of such pixel positions (i,j) is classified into partial regions connected on the image and the summation following the equation (1) is made for only pixel positions (i,j) belonging to a partial region which includes the most pixels. Subsequently, the correction of phase distortion is performed in a similar manner.

DESCRIPTION OF THE PREFERRED EMBODIMENTS

First of all, the principle of a method according to the present invention for solving the problem in the above-mentioned conventional correction method (2) will be explained.

A complex image reconstructed can be represented as follows:

$$C_{ik} = R_{ik} \cdot \exp(j\theta_{ik}) + n_{ik} \quad (3)$$

where $C_{ik}$ is the reconstructed complex image (at the value of a complex number), $R_{ik}$ a true image to be obtained (at the value of a real number), $\theta_{ik}$ a phase distortion (at the value of a real number), $n_{ik}$ noises (at the value of a complex number), j the unit of an imaginary number equal to $\sqrt{-1}$, and i and k indices representative of the position of a pixel. A reconstructed complex image $C_{mn}$ in each of blocks into which the reconstructed complex image $C_{ik}$ is divided can be represented as follows:

$$\begin{array}{c} C_{mn} = R_{mn} \cdot \exp(j\theta_{mn}) + n_{mn} \\ (m < i, n < k) \\ -\pi \leq \theta_{mn} < \pi. \end{array} \quad (4)$$

In the case where $\theta_{mn}$ does not satisfy the inequality in the relation (4), $\theta_{mn}$ takes apparently discontinuous values since it takes periodical values every $2\pi$. The division of $C_{ik}$ into the blocks or $C_{mn}$ is done for preventing the discontinuity of the phase distortion to occur in $C_{mn}$ and for making the non-linearity of large non-linear phase distortion in $C_{ik}$ small. If the non-linearity is made small, any apparent discontinuity of phase distortion which may exist in a block can be removed by a process which corresponds to steps 105 to 107 in FIG. 1.

First, $C_{mn}$ is Fourier-transformed as follows:

$$B_{xy} = F(C_{mn}).$$

Next, coordinates (x', y') at which the absolute value of $B_{xy}$ takes its maximum value are determined. Further, a phase rotation angle A at (x', y') represented by $$A = \cos^{-1}(\text{real}(B_{x',y'})/|B_{x'y'}|)$$

is calculated. Provided that the origin for $C_{mn}$ is (N/2, N/2) (N: the size of a block), the correction of phase distortion in the block can be realized by the following equation:

$$D_{mn} = C_{mn} \cdot \exp[2\pi j(((x' - N/2)(m - N/2) + (y' - N/2)(n - N/2))/N + A)].$$

This phase distortion correction results in that the peak position of $B_{xy}$ is made equal to or lower than one sample point of discrete Fourier transformation. But, precise correction is not still attained. Therefore, the remaining phase distortion is estimated and corrected by means of the least square method (to obtain a corrected image $E_{mn}$).

Figure 1:
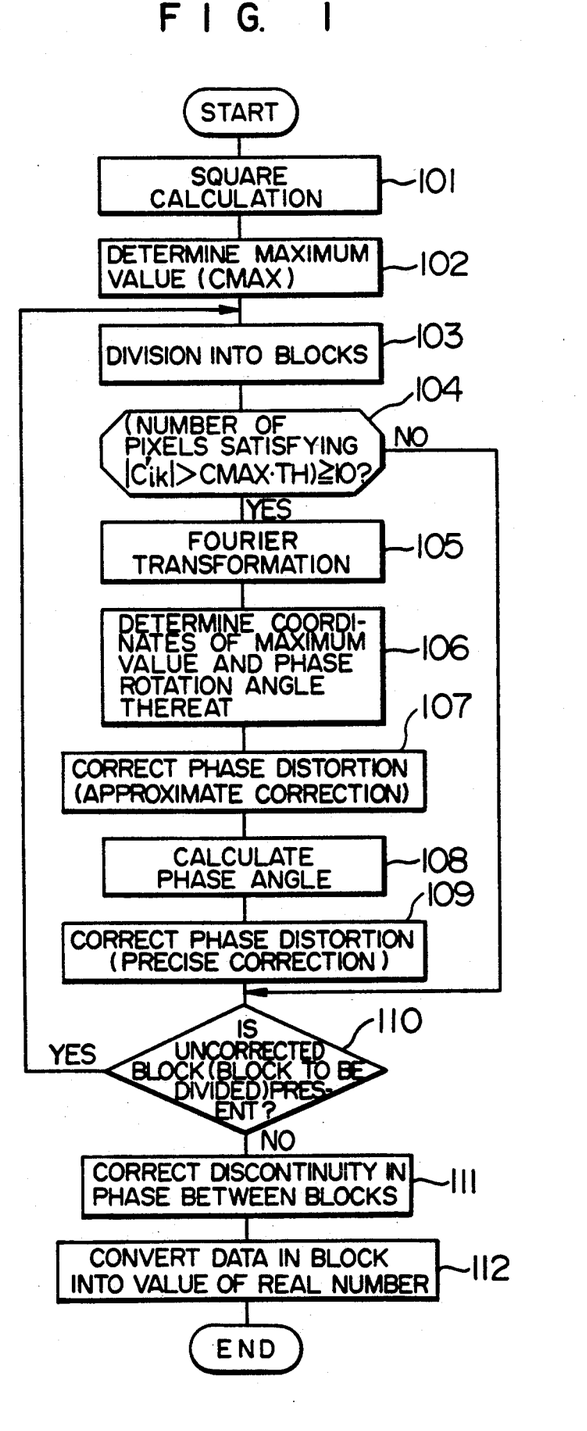
FIG. 1 is a flow chart of phase distortion correction for explaining an embodiment of the present invention

However, apparent discontinuity of phase distortion still exists between blocks. This discontinuity is corrected by comparing it with a calculated offset value of the phase distortion between blocks (see step 111 in FIG. 1). As shown by the equation (3), the reconstructed image assumes only a real part when no phase distortion exists. Therefore, the values of image data in a block are converted into real numbers by the following equation:

$$G_{mn} = |F_{mn}| \cdot \text{sign}(\text{real}(E_{mn}))$$

where $G_{mn}$ is a block image (at the value of a real number) after correction, $F_{mn}$ a block image (in the value of a complex number) after step 111 of FIG. 1 has been performed, sign(x) the sign (+1 or -1) of a real number x, and "real" a function by which the real part of a complex number is determined. In this manner, the phase distortion can be corrected with high precision.

As for an image containing positive and negative values as obtained by the IR method or the like, the estimation and correction of phase distortion can be made in such a manner that the image is squared to separate the phase distortion from the positive and negative information.

Explanation will now be made of a first embodiment of the present invention in which phase distortion contained in a complex image obtained by the IR method is corrected according to a method of the present invention.

Figure 2:
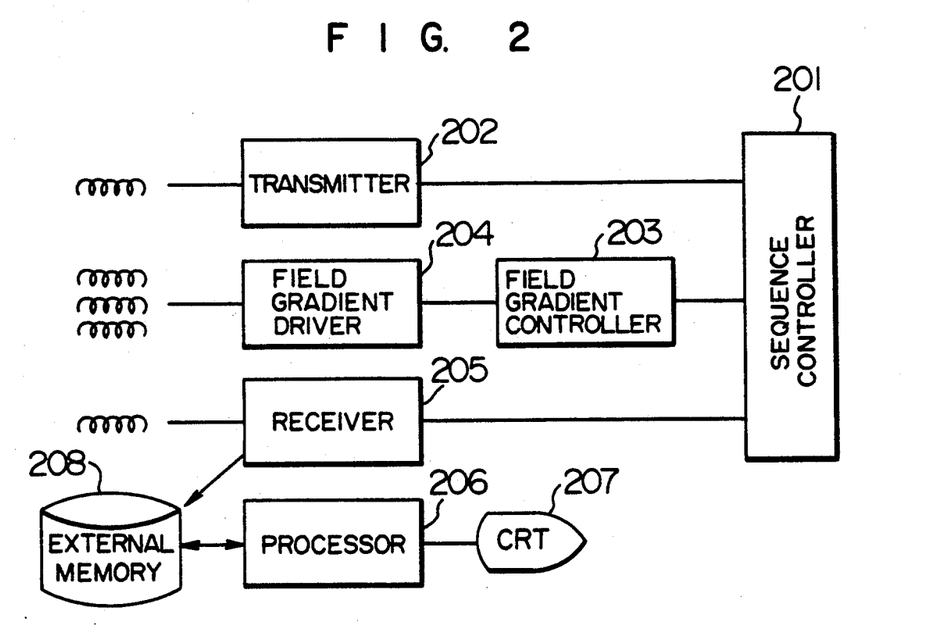
FIG. 2 shows in block diagram an MR imaging system to which the present invention is applied.

FIG. 2 is a block diagram of an MR imaging system which embodies the present invention. The system comprises a sequence controller 201 for controlling components of the system in accordance with a predetermined procedure in order to detect a nuclear magnetic resonance signal from an object to be examined, a transmitter 202 for RF (or high frequency) magnetic field pulses generated for causing resonance, a field gradient driver 204 for driving field gradients, a field gradient controller 203 for controlling the field gradient driver 204, a receiver 205 for receiving and detecting the magnetic resonance signal generated from the object to be examined, a processor 206 for performing various operations inclusive of image reconstruction processing, phase distortion correction processing, and so on, a CRT display 207 for image display, and an external memory 208 for storing detecting signal data, reconstruction image data, and so on.

Figure 3:
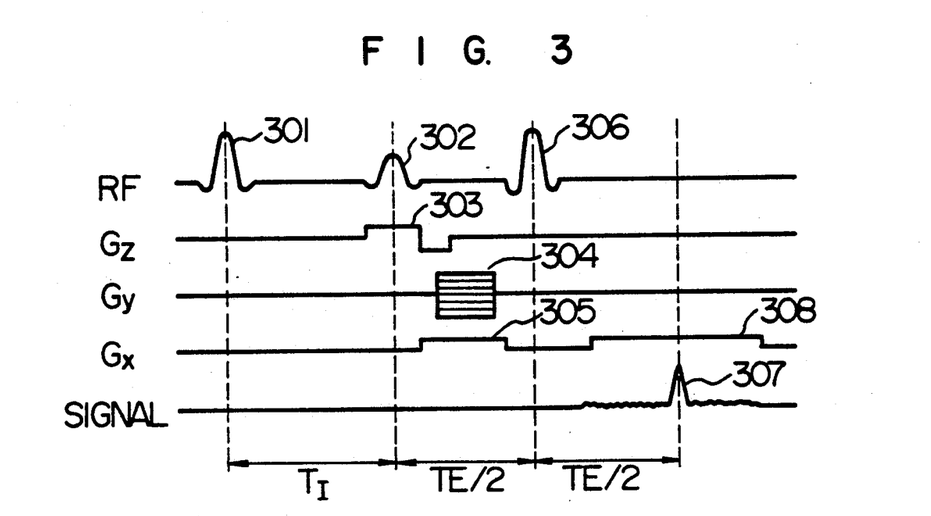
FIGS. 3 and 4 are views showing pulse sequences which are imaging procedures.

A pulse sequence in the above construction using the IR method is shown in FIG. 3. First, a 180° RF magnetic field pulse 301 is applied to invert the direction of nuclear spins in an area of the object to be examined. After the lapse of a time $T_I$, a 90° RF magnetic field pulse 302 and a field gradient pulse 303 for generation of a field gradient $G_Z$ in a z-direction are simultaneously applied to cause the resonance of spins in a slice to be imaged. Next, a field gradient pulse (or phase encoding pulse) 304 for generation of a field gradient $G_y$ in a y-direction and a field gradient pulse 305 for generation of a field gradient $G_x$ in an x-direction are applied and thereafter a 180° RF magnetic field pulse 306 is applied to generate spin echoes. The generated spin echo signal 307 is measured while a field gradient $G_x$ pulse 308 is applied. This sequence is repeated while changing the intensity or amplitude of the phase encoding pulse 304.

It is known that an image reconstructed from data measured in accordance with the sequence shown in FIG. 3 takes a positive or negative value, depending on the value of a parameter of the object called a longitudinal relaxation time and the value of $T_I$ if no phase distortion is present. However, when any phase distortion is present in the reconstructed image, sign information of the reconstructed image is inverted due to the phase distortion, thereby yielding an erroneous reconstructed image. Therefore, it is necessary to correct the phase distortion.

The flow of a processing for correcting with high precision the phase distortion contained in the image reconstructed from the data measured by means of the IR method is shown in FIG. 1 The procedure is as follows.

Step 101: The reconstructed image $C_{ik}$ containing the phase distortion is brought to square, thereby obtaining an image $C'_{ik}=(C_{ik})^2$. This is made in order that sign information contained in the intrinsic image is separated from the phase distortion through the square calculation, thereby allowing the estimation of phase distortion with high precision using the assumption that the phase distortion has a sufficiently gentle change in the image.

Step 102: The absolute value of each pixel of $C'_{ik}$ is produced to determine its maximum value (CMAX).

Step 103: $C'_{ik}$ is divided into blocks $C'_{mn}$. The block size can be determined such that a change of the phase distortion falls within a range from $+\pi$ to $-\pi$, if possible. For example, in the case where the size of the original image is 256×256 pixels and the original image is divided into 4×4 blocks, the size of one $C'_{mn}$ block is 64×64.

Step 104: It is judged how many of the number of pixels in $C'_{mn}$ which satisfy $|C'_{ik}|>$CMAX·TH (TH: a predetermined threshold value) and the predetermined number M of pixels is larger or smaller than the other. For example, TH=0.1 and M=10. In the case of M≦ (the number of pixels satisfying $|C'_{ik}|>$CMAX·TH), the process skips to step 110. In the case of M>(the number of pixels satisfying $|C'_{ik}|>$CMAX·TH), steps 105 to 109 are carried out.

Step 105: The block $C'_{mn}$ is Fourier-transformed to obtain $B'_{xy}$.

Step 106: The absolute value of each complex valued Fourier component $B'_{xy}$ is produced to determine coordinates (x', y') at which the absolute value takes its maximum value. Also, there is determined a phase rotation angle A at (x', y') represented by $$A=\cos^{-1}(real(B'_{x'y'})/|B'_{x'y'}|),$$

where "real" is a function by which the real part of a complex number is determined.

Step 107: A central pixel (N/2, N/2) in $B_{mn}$ is chosen as the origin, N being the block size. It is known that since the value of any image after Fourier-transformation thereof at the origin in a frequency space corresponds to a d.c. component of the image, an image obtained by the Fourier-transformation has its peak value at the origin if no phase distortion is present. Therefore, the presence of any deviation between the origin (N/2, N/2) and the maximum value point (x', y') means that there is phase distortion which changes linearly on the image. Also, since the angle A is a phase rotation angle for the d.c. component, it can be regarded as being the offset of phase distortion in a block. Accordingly, the phase distortion is corrected by the following equation:

$$D'_{mn} = D'_{mn} \cdot \exp [2\pi j (((x' - N/2)(m - N/2) +$$
$$(y' - N/2)(n - N/2))/N + A)].$$

This correction means that the peak position of $B'_{xy}$ is made equal to or lower than one sample point of discrete Fourier-transformation.

Step 108: A phase angle $A'_{mn}$ is calculated from $D'_{mn}$ by the following equation:

$$A'_{mn}=\cos^{-1}(real(D'_{mn})/|D'_{mn}|).$$

In the case where $A'_{mn}$ does not satisfy an inequality of $-\pi \leq A'_{mn} < \pi$, $A'_{mn}$ apparently takes discontinuous values. However, for the processing for phase distortion correction in step 107, $A'_{mn}$ in blocks can be regarded as being phase distortion which is continuous in a range between $+\pi$ and $-\pi$.

Step 109: The least square method is applied to $C'_{mn}$ to estimate the phase distortion. For example, parameters $\alpha$, $\beta$ and $\gamma$ minimizing the equation of $$F(\alpha, \beta, \gamma) = \sum_{m,n} (A'_{mn} - (\alpha m + \beta n + \gamma))^2$$

are estimated.

Though the phase distortion is estimated by the three parameters α, β and γ in the above example, the estimation of parameters may alternately be made by means of hyperbolic approximation. Namely, parameters are estimated which minimizes the equation:

$$F(\alpha, \beta, \gamma, \epsilon) = \sum_{m,n} (A'_{mn} - (\alpha m + \beta m + \gamma mn + \epsilon))^2.$$

Generally, the equation based on m and n used for the estimation of phase distortion may be a multi-term equation of any order. Also, it is of course that the estimation of phase distortion can be made by means of repetitive calculation instead of the least square method though the amount of calculation is increased.

The foregoing process from step 105 results in that the phase distortion contained in the image $C'_{ik}$ obtained by the square calculation in step 101 is estimated (in a doubled form).

Now, let us represent the phase distortion estimated by the foregoing process as follows (taking as an example the case where the phase distortion is estimated by mean of three parameters):

$$P_{lx} = (x' - N/2)(m - N/2)/N + \alpha$$

$$P_{ly} = (y' - N/2)(n - N/2)/N + \beta$$

$$PO = A + \gamma.$$

The phase distortion is corrected by the following equation:

$$E_{mn} = C_{mn} \cdot exp(2\pi j(P_{lx}m + P_{ly}n + PO)/2).$$

As a result, only phase distortion which smoothly or gently changes on an image containing no sign information is corrected.

Step 110: The presence/absence of an uncorrected block is judged. In the case where an uncorrected block is present, the process step returns to step 103. In the case where no uncorrected block is present, the process step proceeds to step 111.

Figure 5A:
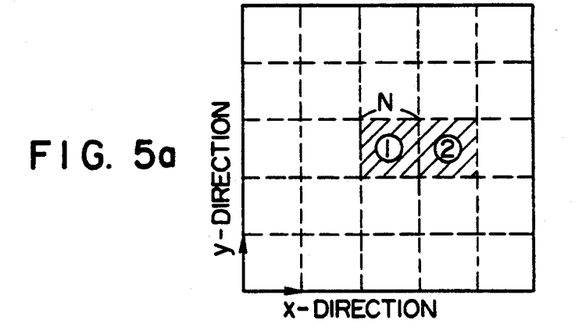
FIGS. 5a to 5c are views for supplementarily explaining step 111 in FIG. 1.

Step 111: The discontinuity in phase between blocks is corrected. This will now be explained by virtue of the example, shown in conjunction with step 109, in which $P_{lx}$, $P_{ly}$ and PO are used. $P_{lx}$ is the phase tilt or inclination in an x-direction in a block, $P_{ly}$ the phase tilt in a y-direction in the block, and PO the offset value. The correction of phase discontinuity between blocks 1 and 2 adjacent to each other in the x-direction as shown by shaded portions in FIG. 5a (in the case where the block 2 is processed on the basis of the block 1) may be effected by determining k (k: integer) which minimizes the equation of $$f = P_{lx} \cdot \frac{x}{2} + PO - PO' + 2k\pi,$$

where $P_{lx}$ is the transversal tilt in the block PO the offset in the block, and PO' the offset in the block 2.

Figure 5B:
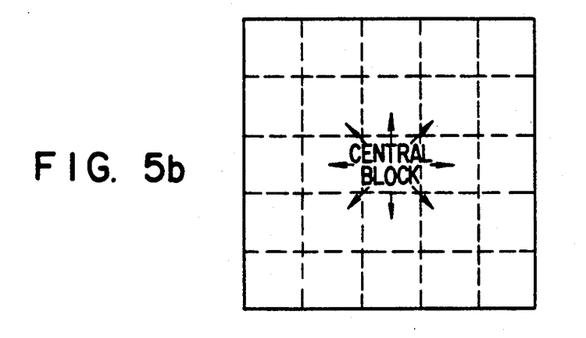
Figure 5C:
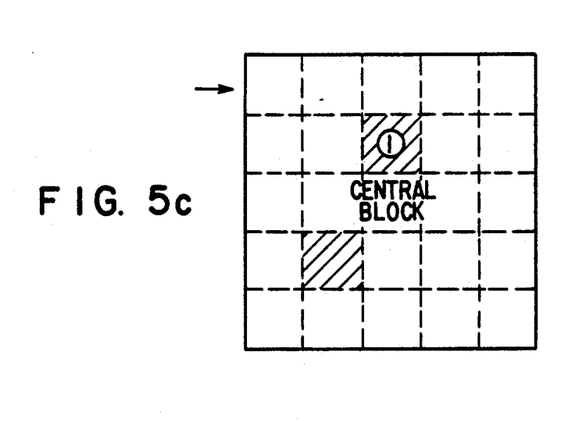

The correction of phase discontinuity between blocks is made in such a manner that it starts from a central block and moves on the surrounding blocks, as shown in FIG. 5b. However, in the case where there is a block as shown in shaded portion in FIG. 5c (a block having been judged in step 104 as one in which the number of pixels satisfying the threshold condition is less), there arises a problem that correction cannot be made for blocks above the shaded block 1. In one solution of this problem, after the above-mentioned correction has been finished, correction is again carried out through blocks indicated by arrow in FIG. 5c. This correction may start from any block.

Step 112: Image data values in each block are converted into real number values. A reconstructed complex image includes in itself only a real part if no phase distortion is present. Accordingly, image data in a block is converted into the value of real number by the equation of $$G_{mn} = |F_{mn}| \cdot sign(real(R'_{mn})),$$

where $F_{mn}$ is an image after step 111, "sign" a function by which a sign is examined, and "real" a function by which the real part of a complex number is determined.

The above-mentioned processing provides $G_{mn}$ in which the phase distortion contained in the image reconstructed from the IR method is corrected with high precision. In the foregoing embodiment, the square (or second-power) calculation has been used in step 101. However, the same effect is attainable even if the n-th power calculation (n: any even number larger than 2) is employed. Also, the same effect can be obtained even if after data has been shifted such that the peak position coordinate (x', y') determined on $B'_{xy}$ obtained through the Fourier-transformation in step 105 is placed onto the origin (N/2, N/2), the phase rotation angle A is corrected and $B'_{xy}$ is thereafter subjected to inverse Fourier-transformation followed by steps in FIG. 1 from step 108 on.

Next, an explanation will be given of a second embodiment of the present invention in which phase distortion contained in a complex image obtained by a method of separating water and fat from each other by means of chemical shift information is corrected according to the method of the present invention.

Figure 4:
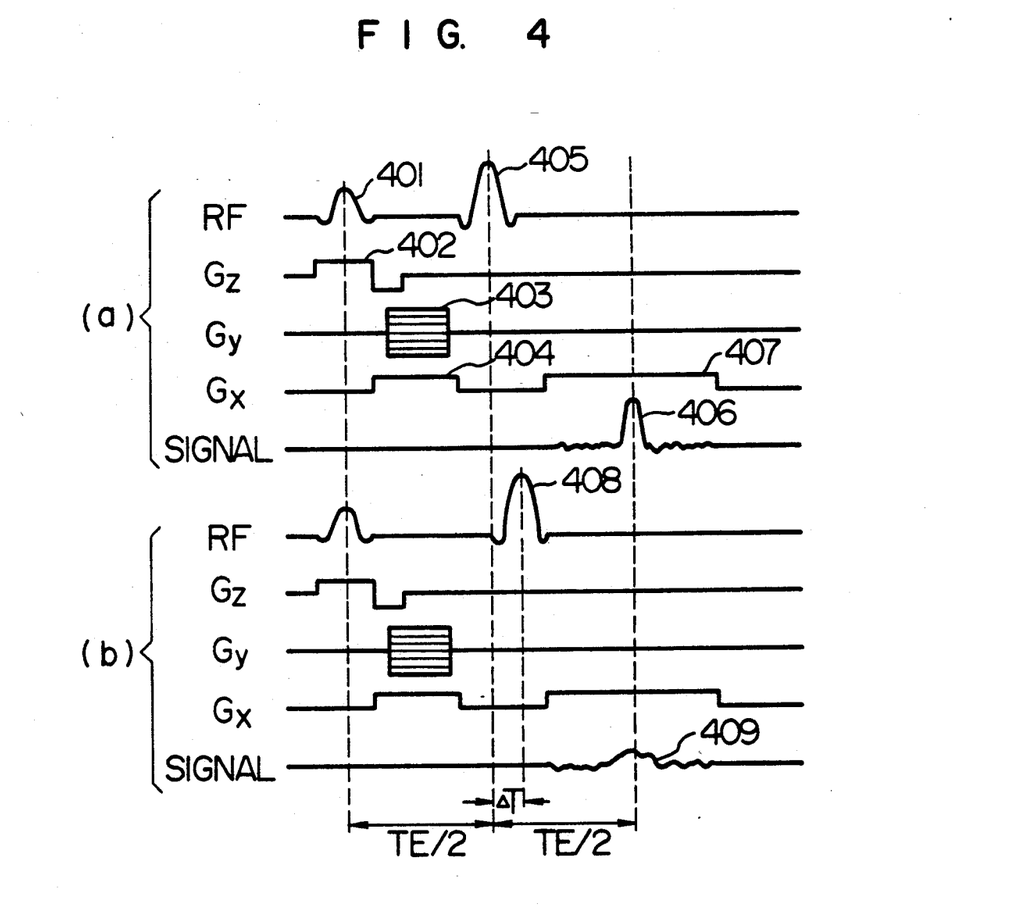

FIG. 4 shows sequences in accordance with which water and fat are separated from each other in the MR imaging system shown in FIG. 2 and explained in conjunction with the first embodiment. The sequence shown in (a) of FIG. 4 corresponds to the case where the 180° RF magnetic field pulse 301 is omitted from the sequence shown in FIG. 3. A spin echo signal 406 is measured by applying a 90° RF magnetic field pulse 401, a field gradient pulse 402 for generation of a field gradient $G_z$ in a z-direction, a field gradient pulse (or phase encoding pulse) 403 for generation of a field gradient $G_y$ in a y-direction, a field gradient pulse 404 for generation of a field gradient $G_x$ in an x-direction, a 180° RF magnetic field pulse 405, and a field gradient $G_x$ pulse 407 at the order shown in (a) of FIG. 4. The sequence shown in (b) of FIG. 4 is different from the sequence shown in (a) of FIG. 4 in that the 180° RF magnetic field pulse 405 in (a) of FIG. 4 is applied at a timing shifted by ΔT, as indicated by 408 in (b) of FIG. 4. It is known that the value of a reconstructed image acquired by the sequence shown in (a) of FIG. 4 is proportional to the density of (water) plus (fat) and the value of a reconstructed image acquired by the sequence shown in (b) of FIG. 4 is proportional to the density of (water) minus (fat) by properly selecting ΔT. From the two images the density image of each of water and fat can be obtained.

The image acquired through the sequence of (b) of FIG. 4 takes positive and negative values, like the image acquired through the sequence of FIG. 3. Accordingly, phase distortion has to be corrected.

A processing for correcting phase distortions contained in the (water) plus (fat) image and the (water) minus (fat) acquired by the sequences shown in (a) and (b) of FIG. 4 will now be explained.

As for the (water) plus (fat) image, since the value of the image is positive, the correction of phase distortion is effected by producing the absolute value of the image.

The sequence of (a) of FIG. 4 is designed such that a change in phase induced by any inhomogeneity of a static magnetic field is cancelled. In the sequence of (b) of FIG. 4, on the other hand, since the RF magnetic field pulse 408 is applied at the timing shifted from the RF magnetic field pulse 405 in (a) of FIG. 4 by ΔT, the phase change induced by the inhomogeneity of the static magnetic field is not cancelled and hence this phase change is added to phase distortion. Therefore, as for the (water) minus (fat) image, the phase change induced by the inhomogeneity of the static magnetic field is preliminarily determined and the determined phase change is corrected before a processing for correction of phase distortion as in the first embodiment is carried out. This is realized by imaging a uniform object called a phantom in the same procedure as a procedure for acquiring a tomographic image. The phantom image obtained contains a phase change induced by the inhomogeneity of the static magnetic field but does not contain a phase change induced by the chemical shift since the phantom is the uniform object. The inhomogeneity of the static magnetic field can be regarded as being sufficiently stable with respect to the lapse of time since it is settled by the shape of the system and so on. Therefore, one preliminary imaging of the phantom suffices. Accordingly, the phase change induced by the inhomogeneity of the static magnetic field ca be corrected by the equation of $$A_{mn} = \cos^{-1}(\text{real}(F_{mn})/|F_{mn}|)$$

$$D_{mn} = C_{mn} \cdot \exp(2\pi j A_{mn}),$$

where $F_{mn}$ is the phantom image, $A_{mn}$ a phase from the phantom image, $C_{mn}$ an image obtained for separating water and fat from each other, and $D_{mn}$ an image obtained by the correction of the phase change induced by the inhomogeneity of the static magnetic field. The correction may be effected by the least square method. In that case, $\alpha$ is first determined which minimizes the equation of $$F(\alpha) = \sum_{m,n} (A'_{mn} - \alpha A_{mn})^2,$$

where $A'_{mn}$ is the phase of the image $C_{mn}$. The correction is effected on the basis of the determined $\alpha$ by the following equation:

$$D_{mn} = C_{mn} \cdot \exp(2\pi j(\alpha A_{mn})).$$

After the phase change induced by the inhomogeneity has been removed through the above procedure, steps 101 to 112 in FIG. 1 are performed.

By the above processing, the water image and the fat image can be obtained from the two images in which phase distortions are corrected with high precision.

Next, an explanation will be given of a third embodiment of the present invention in which phase distortion contained in a complex image acquired through a method of imaging only blood vessels, by use of the fact that the phase of a moving portion such as blood flowing in the blood vessels changes on a reconstructed image (angiography) or through a method of measuring the flow rate of blood on the basis of a proportional relation of the phase change with respect to the flow rate of blood (blood flow measurement) is corrected according to the method of the present invention.

Figure 6:
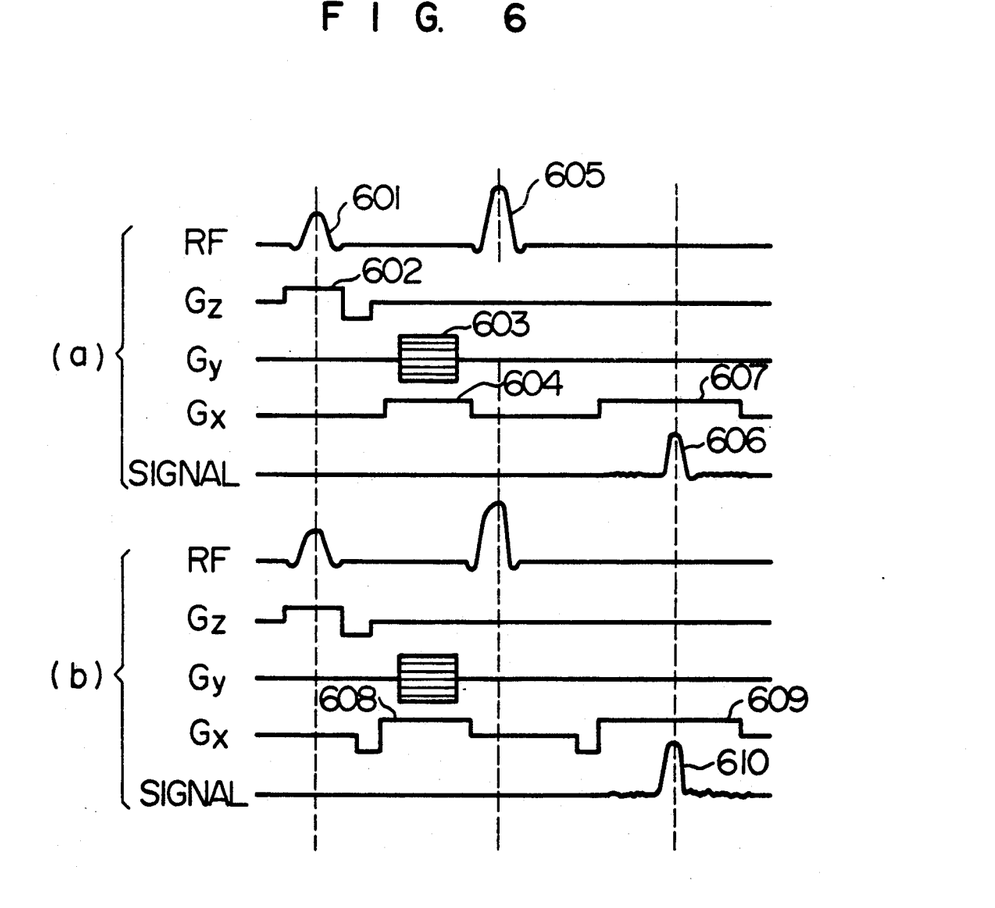
FIG. 6 is views showing pulse sequences.

FIG. 6 shows sequences for the angiography or blood flow measurement in the MR imaging system shown in FIG. 2 and explained in conjunction with the first embodiment. The sequence shown in (a) of FIG. 6 is similar to the sequence of (a) of FIG. 4. The sequence shown in (b) of FIG. 6 is different from the sequence of (a) of FIG. 6 only with respect to field gradients 608 and 609 in an x-direction. The portion indicated by 608 609 shows that a first field gradient and a second or inverted field gradient (having the same amplitude as the first gradient but a sign reverse to the first gradient) are applied in the x-direction. In the case of a stationary object, the influences of the first and second gradients are cancelled from each other because the object involves no motion. The moving portion or blood is sensible of the different magnetic fields so that the influences of the first and second gradients are not cancelled, thereby changing the phase of spins. Since this phase change is proportional to the flow rate of the blood, the flow rate can be determined if the phase change is determined.

If each of two images acquired by the sequences of (a) and (b) of FIG. 6 contains no phase distortion, it can be considered that a phase change is not present except in a moving portion associated with the blood flow. In that case, the phase change can be determined from the two images. A portion the phase of which is changing corresponds to the position of blood vessels and the blood flow rate can be determined on the basis of that phase change.

In practice, however, the image contains phase distortion and the phase distortions contained in the two images are different from each other if imaging instants of time and/or imaging sequences are different.

The processing for phase distortion correction in the above-mentioned case will now be explained.

Images acquired by the sequences shown in (a) and (b) of FIG. 6 can be represented as follows:

$$f_{ik} = F_{ik} \cdot \exp(j\theta_{ik})$$

$$g_{ik} = G_{ik} \cdot \exp(j\psi_{ik})$$

where $f_{ik}$ is a (complex) image reconstructed from the sequence of (a) of FIG. 6, $F_{ik}$ n true (complex) image obtained from the sequence of (a) of FIG. 6, $\theta_{ik}$ phase distortion in the case of (a) of FIG. 6, $g_{ik}$ is a (complex) image reconstructed from the sequence of (b) of FIG. 6, $G_{ik}$ a true (complex) image obtained from the sequence of (b) of FIG. 6, and $\psi_{ik}$ phase distortion in the case of (b) of FIG. 6.

In order to separate the flow induced phase change and the phase distortion from each other, $f_{ik} \cdot g_{ik}^*$ (*: complex conjugate) is calculated as follows:

$$f_{ik} \cdot g_{ik}^* = F_{ik} G_{ik}^* \cdot \exp(j(\theta_{ik} - \psi_{ik})).$$

At this point of stage, steps 102 to 112 of FIG. 1 are performed to estimate $\theta_{ik} - \psi_{ik}$ as a phase which smoothly changes on the image. The estimated value of $\theta_{ik} - \psi_{ik}$ is used to change the phase of $g_{ik}$ as shown by the following equation:

$$\begin{aligned} g'_{ik} &= g_{ik} \cdot \exp(j(\theta_{ik} - \psi_{ik})) \\ &= G_{ik} \cdot \exp(j\psi_{ik}) \cdot \exp(j(\theta_{ik} - \psi_{ik})) \\ &= G_{ik} \cdot \exp(j\theta_{ik}). \end{aligned}$$

As the result of the above processing, a smooth phase distortion change other than the flow induced phase change can be eliminated. Thus, the flow induced phase change can be determined by determining $f_{ik} - g'_{ik}$, thereby realizing the blood flow measurement or angiography.

Next, the principle of a method according to the present invention for solving the problem in the earlier mentioned conventional correction method (1) will be explained.

Phase distortion appearing on an image is caused from a plurality of factors. Main factors include the inhomogeneity of a static magnetic field and the eddy current effect induced by gradient switching. If each of the patterns of phase distortions caused from those factors is measured and stored, any phase distortion contained in image data acquired through any given imaging procedure can be represented by a summation of the plurality of phase distortion patterns with weighting factors, thereby allowing highly precise phase distortion correction without frequently imaging a phantom.

When the phase distortion is large, there may be the case where it is beyond a range from $-180°$ to $180°$. However, even in that case, the value of an "arg" (argument) function gives $-180° \leq \theta_{ij} < 180°$. Therefore, $\theta_{ij}$ involves the uncertainty of $\pm 360° \cdot n$ (n: an integer). In the case where $\alpha^{(k)}$ is determined on the basis of the equation (1) (see SUMMARY OF THE INVENTION), errors occur if such uncertainty exists. But, since the most of the values of $\theta_{ij}$ fall within the range from $-180°$ to $180°$, the approximate value of $\alpha^{(k)}$ can be determined. Accordingly, the precision of phase distortion correction can be further improved if after the phase distortion has been corrected in accordance with the equation (2) (see SUMMARY OF THE INVENTION) by use of the approximately determined $\alpha^{(k)}$, the above-mentioned procedure for phase distortion correction is repeated again.

As one approach of eliminating the uncertainty is known a method in which the fact that $\theta_{ij}$ itself smoothly or gently changes is utilized to determine the value of n in $\pm 360° \cdot n$ such that the values of phase distortions of adjacent pixels are smoothly connected with each other. As for a tomographic image of a human body, however, there may be a possibility that the image is affected by noises since regions (such as coelomata) involving no or weak signal exist in the human body. Even in that case, if the values of the phase distortions are limited to a range of, for example, from $-90°$ to $90°$ and pixel positions (i, at which the phase distortions have their values in the limited range are divided into regions which are connected the uncertainty can be eliminated in each region. Accordingly, if one of the regions is selected and $\alpha^{(k)}$ is determined on the basis of the equation (1) by use of only pixels which belong to the selected region, at least the approximate value of $\alpha^{(k)}$ can be obtained.

A concrete example will now be described by virtue of FIGS. 2 and 7.

Figure 7:
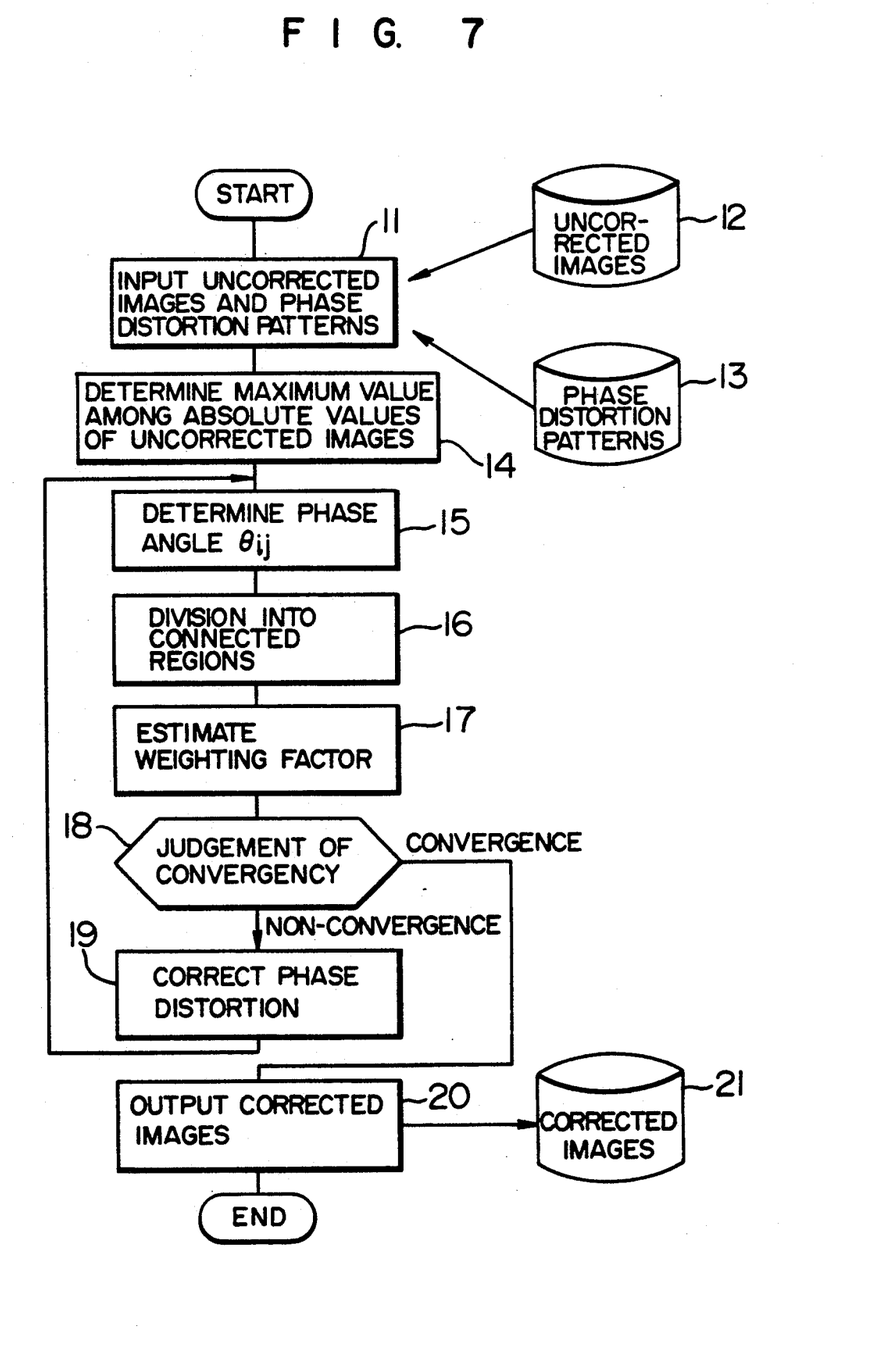
FIG. 7 is a flow chart of phase distortion correction for explaining another embodiment of the present invention.

FIG. 7 shows a processing of phase distortion correction for image data acquired by the system shown in FIG. 2. First or in advance, a phantom is imaged under various imaging conditions and the patterns of phase distortions produced are stored into a memory 13. The correction processing is performed in accordance with the following steps.

Step 11: Uncorrected images $C_{ij}$ (i, j = 1, 2, ..., N) at the values of complex numbers containing phase distortions and M phase distortion patterns $\psi_{ij}^{(k)}$(i, j = 1, 2, ..., N and k = 1, 2, ..., M) at the values of real numbers are inputted from memories 12 and 13, respectively.

Step 14: The maximum value among the absolute values $|C_{ij}|$ of the uncorrected images $C_{ij}$ is determined.

Step 15: The phase angle $\theta_{ij}$ is determined by $\theta_{ij} = \arg(C_{ij})$. Here, $-180° \leq \theta_{ij} < 180°$.

Step 16: There are selected or searched pixel positions (i, j) at which the phase angle $\theta_{ij}$ determined in step 15 satisfies $-90° \leq \theta_{ij} < 90°$. Namely, binary images $B_{ij}$(i, j = 1, 2, ..., N and $B_{ij}$ = 0 or 1) having the same sizes of the uncorrected images $C_{ij}$ are prepared and $B_{ij}$ is defined as follows.

$$B_{ij} \begin{cases} = 1 \text{ (in the case of } -90° \leq \theta_{ij} < 90° \text{ and} \\ \phantom{=1} |C_{ij}| > A_{max} \cdot T_h) \\ = 0 \text{ (in the other case)} \end{cases}$$

Here, $T_h$ is a parameter to determine a threshold value and may be, for example, 0.1. The condition of $|C_{ij}| > A_{max} \cdot T_h$ is provided for eliminating locations at which the influence of noises is large. A process is applied to the binary images $B_{ij}$ and the pixel positions (i, j) are classified and divided into several connected regions of "k1". This classification and division process is described by many articles (see, for example pages 75 to 76 of the book entitled "Introduction to Computer Image Processing" and edited by the Nippon Kogyo Center under the supervision of Hideyuki Tamura). Any classification and division algorithm can be used without giving any influence in embodying the present invention. One region where the number of pixels included is the maximum is selected among the classified connected regions and $B_{ij}$ for the other regions are set to be "0".

Step 17: There is determined $\alpha^{(k)}$ which minimizes $$F = \sum_{(k,j), B_{ij} = 1} \left( \theta_{ij} - \sum_{k=1}^{M} \alpha^{(k)} \psi_{ij}^{(k)} \right)^2.$$

The summation is made over all of (i, j) which give $B_{ij} = 1$. The value of $\alpha^{(k)}$ is determined by solving M simultaneous first-degree equations $$\frac{2F}{2\alpha^{(k)}} = 0 \ (k = 1, 2, \ldots, M)$$

by means of a general technique of the least square method.

Step 18: judgement is made as the process of minimizing converges of whether or not the phase distortion correction ha been made with satisfactory precision. Namely, provided that a required precision of correction is P (in the unit of degree), the fulfillment of the relation of $$\left| \sum_{k=1}^{M} \alpha^{(k)} \psi_{ij}^{(k)} \right| < \frac{P}{2}$$

for all of pixel positions (i, j) is decided as convergence and the other is regarded as non-convergence. When the decision of convergence is made, the process step proceeds to step 20. If the decision of non-convergence is made, the process step proceeds to step 19. Step 19: In the case of non-convergence, the correction of phase distortion is made by the following equation:

$$C_{ij} \leftarrow C_{ij} \cdot \exp\left[ -\sqrt{-1} \sum_{k=1}^{M} \alpha^{(k)} \psi_{ij}^{(k)} \right]$$

(for all of i and j).

After the approximate correction following the above equation has been made, steps from step 15 on are repeated.

Step 20: In the case of convergence, phase distortion-corrected images $C_{ij}$ are outputted to a memory 21.

By the above-mentioned flow of processing, the processing for phase distortion correction is effected.

In the above processing, the phase distortion patterns $\psi_{ij}^{(k)}$ are stored in the memory 13 as they are. However, this step can be combined with a method in which the phase distortion patterns are subjected to proper compression processing to reduce the amount of data. The compression is reversed and the original data are restored upon read-out. Also, though the phase angle $\theta_{ij}$ is limited to the range of $-90° \leq \theta_{ij} < 90°$ in step 16, the present invention is effective even if a partial range from $-180°$ to $180°$ including 0 is employed. Further, though $\alpha^{(k)}$ is determined through the least square method, the other optimization techniques are applicable to obtain similar effects.

According to the present invention, there is provided a benefit in that non-linear phase distortion contained in a complex image acquired by an MR imaging system can be corrected from only the acquired image, with the small amount of calculation and with high precision without a need of performing the phase distortion correction by use of a phantom for every imaging process, whereby imaging with satisfactory precision is possible in an imaging method (such as IR method, Dixon method or the like) in which an object to be examined is imaged by use of phase information. There are also provided benefits in that phase distortion on a tomographic image generated due to a plurality of factors can be corrected with high precision by using phase distortion patterns which are preliminarily measured and stored and that phase distortion change depending on imaging procedures can be corrected by changing weighting factors for the phase distortion patterns. Therefore is possible to omit the complicated operation of requiring the image of a phantom to be formed for every imaging process.

We claim:

1. A phase distortion correcting method in a magnetic resonance imaging system, comprising:
   a step of generating a static magnetic field, field gradients and an RF magnetic field;
   a step of detecting a magnetic resonance signal produced from a desired area of an object to be examined by the generated magnetic fields and field gradients;
   a step of reconstructing an image from the detected signal, said image consisting of an array of complex valued pixels;
   a step of establishing a plurality of one or more partial regions on the reconstructed complex image, each of said partial regions being a subset of complex valued pixels from said array;
   a step of determining a phase distortion contained in the complex valued pixels in each said partial region;
   a step of processing said pixels, utilizing said determined phase distortion, to correct said phase distortion of each of said partial regions.

2. A phase distortion correcting method according to claim 1, wherein said establishing step includes establishing said partial regions in a superimposed manner.

3. A phase distortion correcting method according to claim 1, wherein the establishing step includes establishing said partial regions so that they are not superimposed.

4. A phase distortion correcting method according to claim 1, wherein the establishing step includes establishing a shape of each of said partial regions such that it is rectangular.

5. A phase distortion correcting method according to claim 1, wherein the phase distortion correcting step includes correcting linear phase distortion contained in the partial region.

6. A phase distortion correcting method according to claim 1, wherein the phase distortion correcting step includes Fourier-transforming image data included in the partial region.

7. A phase distortion correcting method according to claim 6, where the Fourier-transformation is followed by determining a peak position of data after Fourier transformation and a phase rotation angle at said peak position so as to remove a phase distortion from each of said partial regions, leaving a remaining phase distortion which has a predetermined range of value.

8. A phase distortion correcting method according to claim 7, wherein the phase distortion correcting step includes correcting the remaining phase distortion in the partial region.

9. A phase distortion correcting method according to claim 8, wherein the phase distortion correcting step includes correcting the phase distortion in the partial region by means of least square method.

10. A phase distortion correcting method according to claim 1, wherein the phase distortion correcting step includes correcting the phase distortion of each of the partial regions through iterative calculation.

11. A phase distortion correcting method according to claim 1, wherein the phase distortion correcting step includes imaging a uniform object called a phantom, utilizing said steps of generating a static magnetic field, detecting a magnetic resonance signal and reconstructing an image, to obtain phase distortion information, and preliminarily correcting the phase distortion by use of said phase distortion information.

12. A phase distortion correcting method according to claim 1, wherein the phase distortion correcting step includes preliminarily estimating phase distortion by use of a complex image obtained by raising each reconstructed complex pixel value within said reconstructed complex image to an N-th power, where N is an even number, and correcting the phase distortion in the partial regions by 1/N times as large as the estimated phase distortion.

13. A phase distortion correcting method according to claim 1, further comprising a step of displaying an Inversion Recovery real image after the phase distortion has been corrected.

14. A phase distortion correcting method according to claim 1, further comprising determining a water image and a fat image which are separated from each other, after the phase distortion has been corrected.

15. A phase distortion correcting method according to claim 1, further comprising determining the flow rate of blood in blood vessels and the shape of the blood vessels after the phase distortion has been corrected.

16. A phase distortion correcting method in a magnetic resonance imaging system, comprising:
    a step of generating a static magnetic field, field gradients and an RF magnetic field;
    a step of detecting a magnetic resonance signal produced from a desired area of an object to be examined by the generated magnetic fields and field gradients;
    a step of preliminary measuring and storing a plurality of phase distortion patterns; and
    a step of correcting phase distortion included in a complex image data which has been reconstructed from the detected signal by representing the phase distortion as a summation of said plurality of phase distortion patterns with weighting factors, said correcting step including a determination of said phase distortion contained in said complex image data and an adjustment of said weighting factors in accordance with said determined phase distortion.

17. A phase distortion correcting method according to claim 16, wherein said weighting factors minimize a summation of the squared value of phase distortion after correction.

18. A phase distortion correcting method according to claim 16, wherein the correcting step is repeated for complex image data after correction of phase distortion.

19. A phase distortion correcting method according to claim 16, wherein a limited range of values which the phase distortion of said complex reconstructed image data can take is established and said weighting factors are determined by use of only complex image data having phase distortion having a value which falls within said limited range.

20. A phase distortion correcting method according to claim 19, wherein the complex image data having phase distortion the value of which falls within said limited rage is classified into at least one partial region consisting of a plurality of neighboring image pixels, and said weighting factors are determined by only complex image data which belong to said at least one region.

21. A phase distortion correcting method according to claim 20, wherein said at least one partial region is one in which a number of pixels belonging thereto becomes the maximum.

22. A phase distortion correcting apparatus in a magnetic resonance imaging system, comprising:
    means for generating a static magnetic field, field gradients and an RF magnetic field;
    means for detecting a magnetic resonance signal produced from a desired area of an object to be examined by the generated magnetic fields and field gradients;
    means for reconstructing an image consisting of complex value pixels from the detected signal;
    means for establishing partial regions with any shapes on the reconstructed complex image;
    means for determining a phase distortion contained in the complex valued pixels in each said partial region;
    means for processing said pixels, utilizing said determined phase distortion, to correct said phase distortion in each of said partial regions.

23. A phase distortion correcting apparatus in a magnetic resonance imaging system, comprising:
    means for generating a static magnetic field, field gradients and an RF magnetic field;
    means for detecting a magnetic resonance signal produced from a desired area of an object to be examined by the generated magnetic fields and field gradients;
    means for storing a plurality of phase distortion patterns preliminary measured; and
    means for correcting phase distortion included in complex image data reconstructed from the detected signal by representing the phase distortion as a summation of said distortion patterns with weighting factors, said correcting means including means for determining said phase distortion contained in said complex image data and means for adjusting said weighting factors in accordance with said determined phase distortion.

* * * * *